US008115712B2

(12) United States Patent
Cheng et al.

(10) Patent No.: US 8,115,712 B2
(45) Date of Patent: Feb. 14, 2012

(54) METHOD FOR REDUCING AUDIO NOISE OF DISPLAY AND DRIVING DEVICE THEREOF

(75) Inventors: Fu-Yen Cheng, Hsinchu County (TW); Chia-Yin Chiang, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 1110 days.

(21) Appl. No.: 11/947,793

(22) Filed: Nov. 30, 2007

(65) Prior Publication Data

US 2009/0086994 A1 Apr. 2, 2009

(30) Foreign Application Priority Data

Sep. 27, 2007 (TW) ............................... 96135917 A

(51) Int. Cl.

| | |
|---|---|
| ***G06F 3/033*** | (2006.01) |
| ***G06F 3/038*** | (2006.01) |
| ***G06F 3/041*** | (2006.01) |
| ***G09G 3/36*** | (2006.01) |
| ***G09G 5/00*** | (2006.01) |
| ***H03B 29/00*** | (2006.01) |
| ***H04B 15/00*** | (2006.01) |

(52) U.S. Cl. ............ 345/87; 345/95; 345/173; 345/179; 345/212; 381/71.1; 381/94.6

(58) Field of Classification Search ................. 381/71.1, 381/94.6; 345/95, 173, 179, 212
See application file for complete search history.

(56) References Cited

U.S. PATENT DOCUMENTS

| | | | | |
|---|---|---|---|---|
| 5,400,049 | A * | 3/1995 | Yoshii | 345/97 |
| 5,923,320 | A * | 7/1999 | Murakami et al. | 345/179 |
| 6,229,513 | B1 * | 5/2001 | Nakano et al. | 345/99 |
| 7,190,338 | B2 * | 3/2007 | Kubota et al. | 345/89 |
| 7,920,128 | B2 * | 4/2011 | Park et al. | 345/173 |
| 2002/0067324 | A1 * | 6/2002 | Aoki | 345/87 |
| 2005/0030303 | A1 * | 2/2005 | Morita et al. | 345/204 |
| 2007/0001148 | A1 * | 1/2007 | Adachi et al. | 252/299.63 |
| 2007/0103414 | A1 * | 5/2007 | Aota et al. | 345/87 |
| 2008/0042951 | A1 * | 2/2008 | Kawasa et al. | 345/87 |
| 2008/0084410 | A1 * | 4/2008 | Uehara | 345/211 |
| 2008/0094386 | A1 * | 4/2008 | Park et al. | 345/212 |
| 2008/0316161 | A1 * | 12/2008 | Song et al. | 345/95 |

* cited by examiner

*Primary Examiner* — Elvin G Enad
*Assistant Examiner* — Christina Russell
(74) *Attorney, Agent, or Firm* — Jianq Chyun IP Office

(57) ABSTRACT

A method for reducing audio noise of a display is provided. A horizontal synchronization signal, a reference signal and a substrate voltage signal are generated. The reference signal has a preset width at high level status. The status transition of the substrate voltage signal is based on each scan line corresponding to the horizontal synchronization signal. In each period of the substrate voltage signal, the status transition of the raising and falling edges is based on the high level status of the reference signal, and the transition timings of the raising edges and the falling edges are advanced or delayed based on a reference value of the high level status of the reference signal.

21 Claims, 4 Drawing Sheets

METHOD FOR REDUCING AUDIO NOISE OF DISPLAY AND DRIVING DEVICE THEREOF

CROSS-REFERENCE TO RELATED APPLICATION

This application claims the priority benefit of Taiwan application serial no. 96135917, filed Sep. 27, 2007. The entirety of the above-mentioned patent application is hereby incorporated by reference herein and made a part of this specification.

BACKGROUND OF THE INVENTION

1. Field of the Invention

The present invention relates to a method for reducing audio noise of a display. More particularly, the present invention relates to a method for reducing audio noise of a liquid crystal display (LCD).

2. Description of Related Art

Generally, an LCD device drives each scan line on a display region through inversion driving manner, thereby inverting the scan line and thus eliminating a problem of DC bias residue on the LCD screen. Practically, voltages with opposite polarities are applied on the same scan line of neighboring frames to drive the liquid crystals. In order to achieve the objective, the driving circuit must invert the driving voltage and the substrate voltage of the LCD screen at the same time.

FIG. 1 is a schematic timing diagram for driving a conventional LCD. As shown in the figure, in order to invert the polarity of the driving voltage of the scan line, the substrate voltage VCOM must be inverted following the horizontal synchronization signal (HSD), and the transition timing is at a timing when an output enable signal OEV is at a high level status. The horizontal synchronization signal HSD has a frequency of 15 kHz, so it can be clearly known from FIG. 1 that the frequency of the substrate voltage VCOM is 7.5 kHz.

However, during the inversion driving procedure, that is, when the substrate voltage is inverted, the frequency of the substrate voltage VCOM becomes 7.5 kHz. The substrate voltage signal VCOM with the frequency of 7.5 kHz can generate resonance with the material on LCD screen module, such that an audio noise with a frequency of 7.5 kHz is generated. As shown in FIG. 2, it can be seen that under the frequency of 7.5 kHz, the audio noise reaches up to 22 dB.

The intensity of the audio noise has already reached up to such a degree that human beings can hear. As for those ordinary small-size mobile devices, for example, mobile phones, the LCD screen is close to the user's ear during the call, so the audio noise may cause troubles when the user is listening to the sounds from the phone, and as a result, the communication quality is deteriorated.

In order to solve the problem, in the conventional art, various methods of changing the scanning time for the scan line and reducing the charging time are used, but as a result, the display quality is affected or the cost for altering the circuit design is increased. Therefore, how to reduce the influences caused by the audio noise to the user in a more efficient and cost-effective way has become an urgent issue to be solved in this field.

SUMMARY OF THE INVENTION

Accordingly, the present invention is directed to a method for reducing audio noise of a display, applicable for a line inversion driving display. In the method of the present invention, firstly, a horizontal synchronization signal, a reference signal and a substrate voltage signal are generated. The reference signal has a preset width at a high level status, and a status transition of the substrate voltage signal is based on each scan line corresponding to the horizontal synchronization signal. In each period of the substrate voltage signal, the status transition of raising and falling edges is based on the high level status of the reference signal, and transition timings of the raising and falling edges are advanced or delayed based on a reference value of the high level status.

In addition, the present invention is further directed to a method for reducing audio noise of a display, which includes the following steps. Firstly, a reference signal and a substrate voltage signal are generated. The reference signal has a preset width at a high level status. In each period of the substrate voltage signal, a status transition of the raising and falling edges is based on the high level status of the reference signal, and transition timings of the raising and falling edges are advanced or delayed based on a reference value of the high level status.

In an embodiment of the present invention, the width of the reference signal at the high level status is adjustable. In addition, the reference value of the reference signal at the high level status is the center of the width.

In an embodiment of the present invention, only the transition timings of the raising and falling edges of the substrate voltage signal are delayed or advanced. In addition, the transition timings of the raising and falling edges in each period of the substrate voltage signal are delayed or advanced. Variables for delaying or advancing the raising and falling edges in each period of the substrate voltage signal are randomly generated.

In addition, the present invention is further directed to a display driving device, applicable for reducing audio noise of the line inversion driving display. The driving device of the present invention at least includes a signal generator and a controller. The signal generator is used to generate a horizontal synchronization signal, a reference signal and a substrate voltage signal for each scan line of the display. The reference signal has a preset width at a high level status. The controller controls the substrate voltage signal to perform a status transition based on each scan line corresponding to the horizontal synchronization signal. In each period of the substrate voltage signal, the status transition of the raising and falling edges is based on the high level status of the reference signal, and transition timings of the raising and falling edges are advanced or delayed based on a reference value of the high level status.

In an embodiment of the present invention, the reference signal may be an output enabling signal. In addition, the width of the reference signal at the high level status is adjustable. The reference value of the reference signal at the high level status is the center of the width.

In addition, in an embodiment of the present invention, the controller only controls the delaying or advancing of the transition timings of the raising and falling edges of the substrate voltage signal. In another embodiment, the controller controls the delaying or advancing of the transition timings of the raising and falling edges in each period of the substrate voltage signal. The controller can use a random number generator to generate variables for delaying or advancing the raising and falling edges in each period of the substrate voltage signal.

In addition, in an embodiment of the present invention, the controller is built in a timing controller.

Through the above method or device of the present invention, the present invention can use a spread spectrum manner to effectively reduce the audio noise of the display substrate, without changing the current driving specification and circuit architecture.

In order to make the aforementioned and other objects, features and advantages of the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

One of the technical features of the present invention is to use a spread spectrum manner to adjust the frequency of the substrate voltage VCOM, such that the frequency is not fixed at 7.5 kHz, thereby reducing the generation frequency of the frequency 7.5 kHz and reducing the sound intensity. In order to make the frequency of the substrate voltage VCOM be adjustable, the charging time for each scan line is reduced, that is, the width for the output enabling signal (or called reference signal) OEV is increased, so as to adjust the frequency of the substrate voltage VCOM. Then, the content of the present invention is illustrated below through several embodiments.

Figure 3:
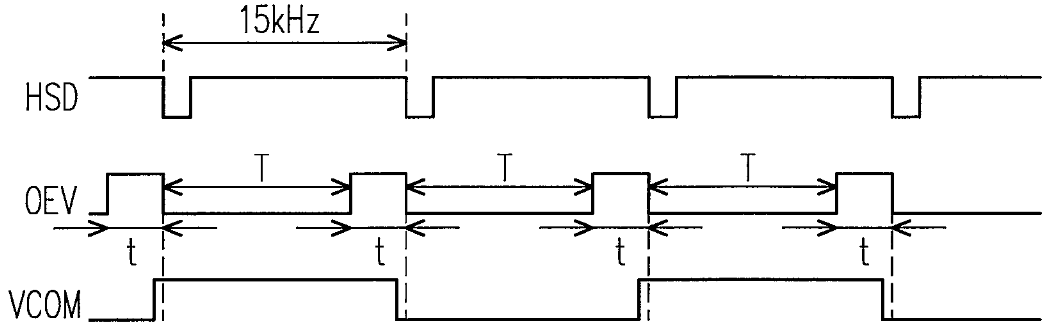
FIG. 3 is a schematic diagram of signals of a method for reducing audio noise of a display according to an embodiment of the present invention.

FIG. 3 is a schematic view of a concept of reducing audio noise of a display according to an embodiment of the present invention. As known from the above descriptions that, the inversion of the substrate voltage VCOM is performed together with the horizontal synchronization signal HSD when the output enabling signal OEV is under the high level status. In order to adjust the frequency of the substrate voltage VCOM without changing the current driving manner, one solution starts from the width of the output enabling signal OEV.

Figure 1:
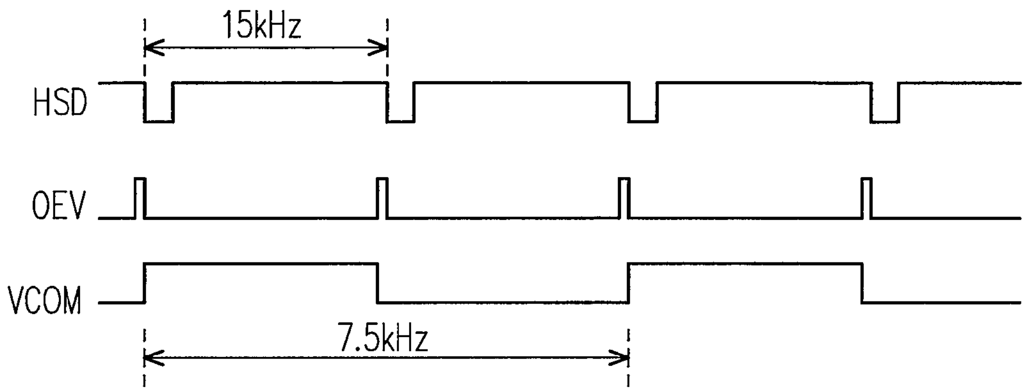
FIG. 1 (PRIOR ART)
FIG. 1 is a schematic timing diagram of driving a conventional LCD.
Figure 2:
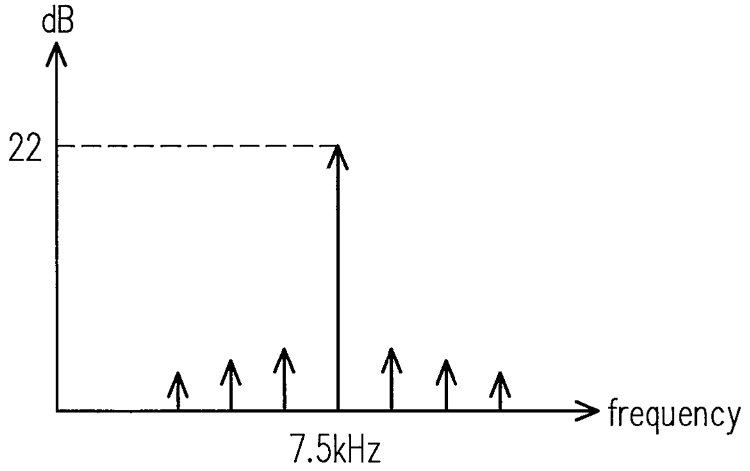
FIG. 2 (PRIOR ART)
FIG. 2 is a measurement result of audio noise for a substrate according to the conventional art.

Comparing FIG. 1 with FIG. 3, under the conventional architecture, the output enabling signal OEV at the high level status is basically a pulse with an extremely short duration, and once the high level status is detected, the status of the substrate voltage VCOM is immediately changed. On the contrary, under the architecture of this embodiment, as shown in FIG. 3, the width of the output enabling signal OEV is widened to have a time interval t. Therefore, under the circumstance of without changing original input format, the width (time width) of the signal OEV is increased to be t and the charging time for each scan line is fixed to be T. Under such a situation, the transition timing of the substrate voltage VCOM can be appropriately adjusted in the high level status with the width t of the signal OEV, thereby eliminating the frequency of 7.5 kHz.

Figure 4:
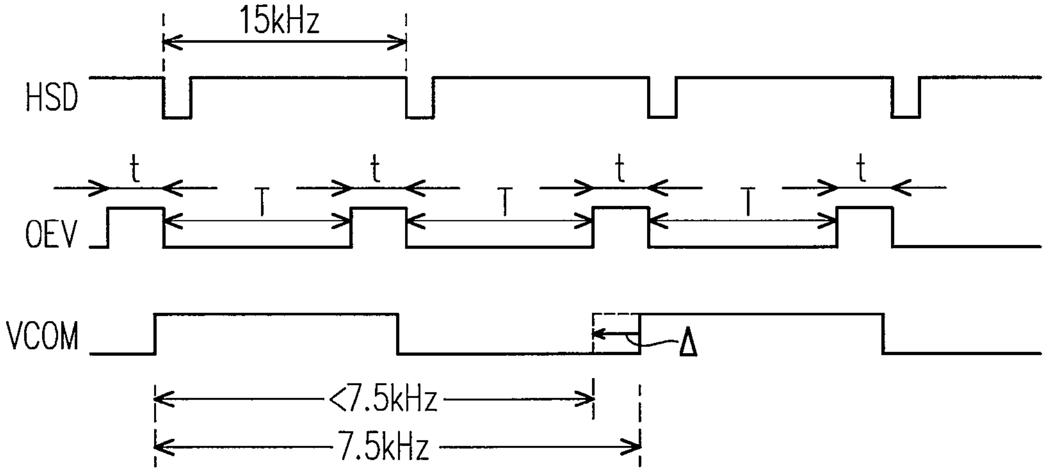
FIG. 4 is a schematic diagram of each signal waveform for reducing audio noise of a display according to an embodiment of the present invention.

Then, the adjusting process is described. FIG. 4 is a schematic diagram of each signal waveform for reducing audio noise of a display according to an embodiment of the present invention. As shown in FIG. 4, the horizontal synchronization signal HSD is maintained without any change, and as shown in FIG. 3, the signal OEV makes the width of the high level status be increased to be t, and the charging time for the scan line is fixed at T. If the signal OEV is not adjusted, at the position close to the falling edge of the signal OEV, the substrate voltage VCOM is raised to the high level status, and then, at the position close to the next falling edge of the signal OEV, the level status of the substrate voltage VCOM is reduced, so as to generate the substrate voltage VCOM. Under this situation, the substrate voltage VCOM is still maintained at the frequency of 7.5 kHz. On the contrary, under the operation manner of this embodiment, the high level status of the signal OEV is widened, so the transition timing (i.e., the raising and falling of the level) of the substrate voltage VCOM is changed to be adjustable and thus satisfies the original input format, that is, the status transition is performed under the high level status of the signal OEV.

As shown in FIG. 4, the next status transition of the substrate voltage VCOM is the high level status based on the raising edge of the signal OEV. That is, the time point for status transition is advanced from the original falling edge of the signal OEV to the raising edge of the signal OEV, i.e., advanced by Δ. Therefore, apparently, the period length of the substrate voltage VCOM is shortened. Namely, the frequency is reduced from the original 7.5 kHz to lower than 7.5 kHz. Through such a mechanism, the appearance possibility of the frequency 7.5 kHz is reduced to achieve the spread spectrum action. As a result, the audio noise with the frequency of 7.5 kHz is lowered and reduced.

The advancing amount Δ can be adjusted, for example, with respect to the reference value of the signal OEV at the high level status. The reference value can be set, for example, in the center of the width. In addition to being advanced by Δ, the transition point can also be delayed by Δ. The timing for delaying or advancing can be directed to the raising edge of the substrate voltage VCOM.

Figure 5:
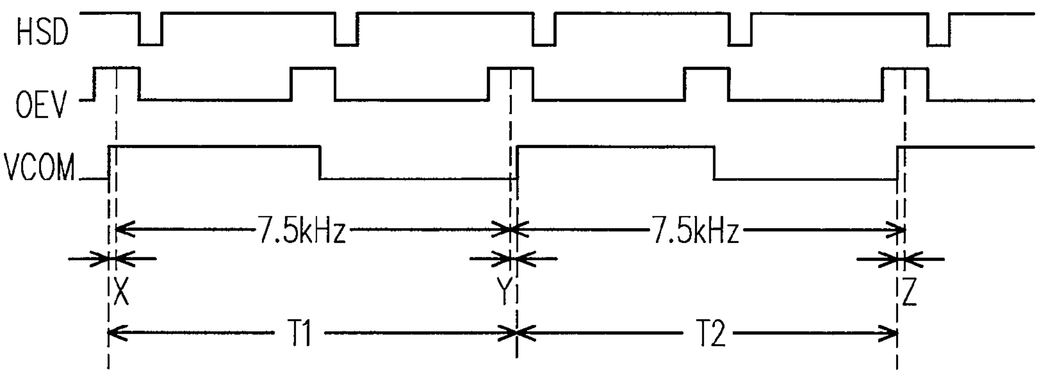
FIG. 5 is a schematic diagram of each signal waveform for reducing audio noise of a display according to another embodiment of the present invention.

FIG. 5 is a schematic diagram of each signal waveform for reducing audio noise of a display according to another embodiment of the present invention. The embodiment shown in FIG. 4 is only the most basic aspect of the present invention, and it merely performs a fine adjustment on the status transition of the substrate voltage VCOM. Then, the slight spread spectrum effect is described below.

In this embodiment, the transition timing of the substrate voltage VCOM for each scan line is appropriately adjusted. As shown in FIG. 5, the central point of the high level status of the signal OEV is taken as the reference, and it is just a period of the substrate voltage VCOM from the first to the third high level status of the OEV in FIG. 5. As the reference, the substrate voltage VCOM is transited from the central point of the high level status of the signal OEV to the high level, and then transited to the low level at the central point of the high level statues of the next signal OEV, and finally to the high level (interval marked by dashed lines in the figure) at the central point of the high level status of the third signal OEV. The period is just half of the horizontal synchronization signal HSD, i.e., 7.5 kHz.

In the operation of this embodiment, under the first high level status of the signal OEV, the substrate voltage VCOM is transited to the high level (corresponding to the first scan line). However, the time point for the status transition of the substrate voltage VCOM shifts from the central point of the high level status of the original signal OEV towards the left side of the drawing for x. Namely, the status transition is advanced by the time x. Next, transiting to the low level (the second scan line) is occurred at the central point of the high level status of the second signal OEV, which is the same as that of the conventional art. Then, under the third high level status of the signal OEV, the substrate voltage VCOM is once again transited to the high level (the third scan line). However, the time point for the status transition of the substrate voltage VCOM shifts from the central point of the high level status of the original signal OEV towards the right side of the drawing for y, that is, the status transition is delayed by time y. The transition timing of the substrate voltage VCOM of the first scan line is advanced by x, and thus, in the next scan line, the time point for the status transition must be delayed by y. In this manner, it is known from FIG. 5 that, Period T1 is greater than the period of the conventional frequency of 7.5 kHz, that is, the frequency of T1 is smaller than 7.5 kHz.

Similarly, the transition timing of the substrate voltage VCOM for the third scan line is delayed by y, so the transition timing of the substrate voltage VCOM corresponding to the next scan line must be advanced, for example, advanced by time z. Similar to the above reasons, it can be known that, the frequency in T2 will be greater than 7.5 kHz. Similar operations are repeated in this manner, that is, each transition timing of the substrate voltage VCOM is advanced or delayed with respect to the central value, and the time variables (the above described x, y, and z) for advancing or delaying are selected as random values, such that the spread spectrum effect is obtained.

Figure 6:
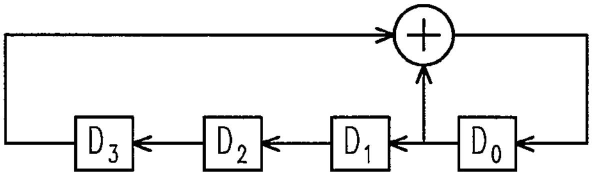
FIG. 6 is a schematic diagram of generating random numbers by a linear feedback shift register.

There are many ways for generating random variables, for example, x, y, and z. An example is cited below for simple demonstration, but it is not intended to limit the present invention. FIG. 6 is a schematic diagram of generating random numbers by a linear feedback shift register. FIG. 6 shows a pseudo noise code manner, that is, the linear feedback shift register is used to generate random number output. In the example shown in FIG. 6, the characteristic polynomial for the recursive relation example is $g(x)=x^4+x^3+1$, in which an initial value is 0001. As known from the following Table 1 that, the period of the group of random numbers is 15. In addition, as the complexity of the characteristic polynomial is increased, more random numbers with larger period can be obtained. Generally, the more the random numbers are, the larger the period is, the better the spread spectrum effect is, and naturally the better the effect of eliminating the audio noise is.

TABLE 1

| $D_3$ | $D_2$ | $D_1$ | $D_0$ |
|---|---|---|---|
| 1 | 0 | 0 | 0 |
| 0 | 0 | 0 | 1 |
| 0 | 0 | 1 | 1 |
| 0 | 1 | 1 | 1 |

TABLE 1-continued

| $D_3$ | $D_2$ | $D_1$ | $D_0$ |
|---|---|---|---|
| 1 | 1 | 1 | 1 |
| 1 | 1 | 1 | 0 |
| 1 | 1 | 0 | 1 |
| 1 | 0 | 1 | 0 |
| 0 | 1 | 0 | 1 |
| 1 | 0 | 1 | 1 |
| 0 | 1 | 1 | 0 |
| 1 | 1 | 0 | 0 |
| 1 | 0 | 0 | 1 |
| 0 | 0 | 1 | 0 |
| 0 | 1 | 0 | 0 |

Figure 7:
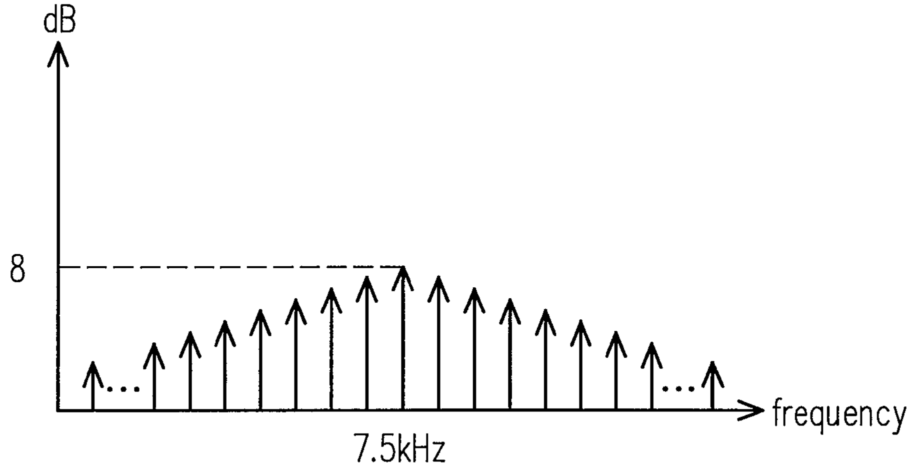
FIG. 7 is a measurement result of audio noise for a substrate according to the present invention.

FIG. 7 is a measurement result of audio of a substrate according to the present invention. Through the spread spectrum manner of this embodiment, it can be clearly known from the audio distribution result after the spread spectrum that, the sound intensity at the frequency of 7.5 kHz is lowered to such an extent that human being cannot sense. Namely, the generation frequency for the frequency of 7.5 kHz is reduced and the sound intensity is lowered to 8 dB, and with such a sound intensity, the human being cannot hear at all. Therefore, according to the method provided by the present invention, the audio noise at the frequency of 7.5 kHz of the substrate voltage can be effectively lowered indeed.

Figure 8:
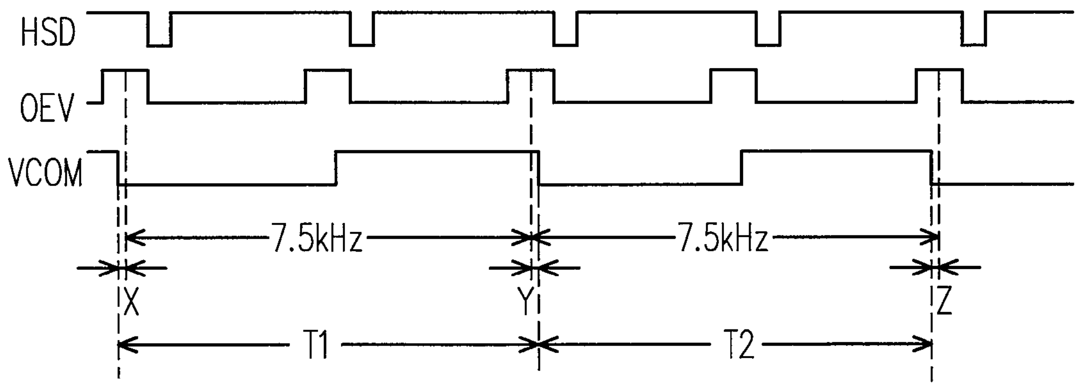
FIG. 8 is a schematic diagram of each signal waveform for reducing audio noise of a display according to still another embodiment of the present invention.

FIG. 8 is a schematic diagram of each signal waveform for reducing audio noise of a display according to still another embodiment of the present invention. The operation manner of FIG. 8 is similar to that of FIG. 5, except that the initial substrate voltage VCOM is at the low level, and at the time, the delay or the advance of the status transition occurs at the falling edge. In addition, the other detailed descriptions can be obtained with reference to the illustration of FIG. 5, which thus will be omitted here.

In the above description, the horizontal synchronization signal, the reference (output enabling) signal and the substrate voltage signal can be generated by the signal generator. The actions of the raising edge or the falling edge of the substrate voltage can be controlled by a controller. The controller can be additionally disposed, or can be achieved by re-programming an ordinary timing controller.

In summary, through the method or the apparatus of the present invention, the present invention can use the spread spectrum manner to effectively reduce the audio noise of the display substrate, without changing the current driving specification and the circuit architecture.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for reducing audio noise of a display, applicable for a line inversion driving display, comprising:
- generating a horizontal synchronization signal;
- generating a reference signal, wherein the reference signal has a preset width at a high level status; and
- generating a substrate voltage signal, wherein a status transition is performed based on each scan line corresponding to the horizontal synchronization signal; in each period of the substrate voltage signal, a status transition of raising and falling edges is based on the high level status of the reference signal; and transition timings of the raising and falling edges are advanced or delayed based on a reference value of the high level status.

2. The method for reducing the audio noise of the display as claimed in claim 1, wherein the reference signal is an output enabling signal.

3. The method for reducing the audio noise of the display as claimed in claim 1, wherein the width of the reference signal at the high level status is adjustable.

4. The method for reducing the audio noise of the display as claimed in claim 1, wherein the reference value of the reference signal at the high level status is the center of the width.

5. The method for reducing the audio noise of the display as claimed in claim 1, wherein only the transition timings of the raising and falling edges of the substrate voltage signal are delayed or advanced.

6. The method for reducing the audio noise of the display as claimed in claim 1, wherein the transition timings of the raising and falling edges in each period of the substrate voltage signal are delayed or advanced.

7. The method for reducing the audio noise of the display as claimed in claim 6, wherein variables for advancing or delaying the raising and falling edges in each period of the substrate voltage signal are randomly generated.

8. A method for reducing audio noise of a display, comprising:

generating a reference signal, wherein the reference signal has a preset width at a high level status; and generating a substrate voltage signal, wherein in each period of the substrate voltage signal, a status transition of raising and falling edges is based on the high level status of the reference signal, and transition timings of the raising and falling edges are advanced or delayed based on a reference value of the high level status.

9. The method for reducing the audio noise of the display as claimed in claim 8, wherein the width of the reference signal at the high level status is adjustable.

10. The method for reducing the audio noise of the display as claimed in claim 8, wherein the reference value of the reference signal at the high level status is the center of the width.

11. The method for reducing the audio noise of the display as claimed in claim 8, wherein only the transition timings of the raising and falling edges of the substrate voltage signal are delayed or advanced.

12. The method for reducing the audio noise of the display as claimed in claim 8, wherein the transition timings of the raising and falling edges in each period of the substrate voltage signal are delayed or advanced.

13. The method for reducing the audio noise of the display as claimed in claim 12, wherein variables for delaying or advancing the raising and falling edges in each period of the substrate voltage signal are randomly generated.

14. A display driving device, applicable for reducing audio noise of a line inversion driving display, at least comprising:

a signal generator, for generating a horizontal synchronization signal, a reference signal and a substrate voltage signal for each scan line of the display, wherein the reference signal has a preset width at a high level status; and a controller, for enabling the substrate voltage signal to perform a status transition based on each scan line corresponding to the horizontal synchronization signal, wherein in each period of the substrate voltage signal, the status transition of raising and falling edges is based on the high level status of the reference signal, and transition timings of the raising and falling edges are advanced or delayed based on a reference value of the high level status.

15. The display driving device as claimed in claim 14, wherein the reference signal is an output enabling signal.

16. The display driving device as claimed in claim 14, wherein the width of the reference signal at the high level status is adjustable.

17. The display driving device as claimed in claim 14, wherein the reference value of the reference signal at the high level status is the center of the width.

18. The display driving device as claimed in claim 14, wherein the controller only controls the delaying or advancing of the transition timings of the raising and falling edges of the substrate voltage signal.

19. The display driving device as claimed in claim 14, wherein the controller controls the delaying or advancing of the transition timings of the raising and falling edges in each period of the substrate voltage signal.

20. The display driving device as claimed in claim 19, wherein the controller uses a random number generator to generate variables for delaying or advancing the raising and falling edges in each period of the substrate voltage signal.

21. The display driving device as claimed in claim 19, wherein the controller is built in a timing controller.

* * * * *